(12) United States Patent
Chen

(10) Patent No.: US 11,280,565 B2
(45) Date of Patent: Mar. 22, 2022

(54) ADAPTING DEVICE AND HEAT DISSIPATION SYSTEM HAVING THE SAME

(71) Applicant: Wistron Corp., New Taipei (TW)

(72) Inventor: Hua Chen, New Tapei (TW)

(73) Assignee: WISTRON CORP., New Taipei (TW)

( * ) Notice: Subject to any disclaimer, the term of this patent is extended or adjusted under 35 U.S.C. 154(b) by 294 days.

(21) Appl. No.: 16/413,831

(22) Filed: May 16, 2019

(65) Prior Publication Data

US 2020/0292253 A1    Sep. 17, 2020

(30) Foreign Application Priority Data

Mar. 13, 2019   (TW) ................................ 108108471

(51) Int. Cl.
  *F28F 27/02*   (2006.01)
  *H05K 7/20*    (2006.01)
  *F28F 9/00*    (2006.01)

(52) U.S. Cl.
  CPC .............. *F28F 27/02* (2013.01); *F28F 9/001* (2013.01); *H05K 7/20272* (2013.01); *H05K 7/20781* (2013.01)

(58) Field of Classification Search
  CPC ...... F28F 27/02; F28F 9/001; H05K 7/20272; H05K 7/20781; H05K 7/20281; H05K 7/20327; H05K 7/20645
  See application file for complete search history.

(56) References Cited

U.S. PATENT DOCUMENTS

| 2005/0122685 A1* | 6/2005 | Chu ..................... H05K 7/2079 361/699 |
| 2007/0074864 A1* | 4/2007 | Ichinose ................. F28F 27/02 165/247 |
| 2009/0126909 A1* | 5/2009 | Ellsworth, Jr ....... H05K 7/2079 165/104.33 |
| 2009/0126910 A1* | 5/2009 | Campbell .......... H05K 7/20781 165/104.33 |

(Continued)

FOREIGN PATENT DOCUMENTS

CN    206113435 U    4/2017

OTHER PUBLICATIONS

Office Action issued by (TIPO) Intellectual Property Office, Ministry of Economic Affairs, R.O.C. dated Jan. 16, 2020 for Application No. 108108471, Taiwan.

*Primary Examiner* — Travis Ruby
(74) *Attorney, Agent, or Firm* — Locke Lord LLP; Tim Tingkang Xia, Esq.

(57) ABSTRACT

The disclosure relates to a heat dissipation system including cabinet, coolant distribution units and adapting device. The adapting device includes casing and switch valves. The casing has first liquid inlets, first liquid outlets, second liquid inlet and second liquid outlet. The first liquid inlets are connected to distribution outlets of coolant distribution units, first liquid outlets are connected to distribution inlets of coolant distribution units, second liquid inlet is connected to cabinet, and second liquid outlet is connected to cabinet. The switch valves are connected to first liquid inlets, first liquid outlets, second liquid inlet and second liquid outlet so as to change a connection among first liquid inlets, first liquid outlets, second liquid inlet and second liquid outlet to change a connection between coolant distribution units.

6 Claims, 8 Drawing Sheets

(56) References Cited

U.S. PATENT DOCUMENTS

| | | | | |
|---|---|---|---|---|
| 2010/0078160 A1* | 4/2010 | Novotny | ................. | F28F 27/00 |
| | | | | 165/247 |
| 2010/0236772 A1* | 9/2010 | Novotny | ............ | H05K 7/20836 |
| | | | | 165/287 |
| 2011/0056668 A1* | 3/2011 | Taras | ...................... | F28F 1/022 |
| | | | | 165/174 |
| 2011/0075373 A1* | 3/2011 | Campbell | .......... | H05K 7/20609 |
| | | | | 361/701 |
| 2011/0232889 A1* | 9/2011 | Eckberg | ................ | F28D 1/0477 |
| | | | | 165/200 |
| 2011/0265983 A1* | 11/2011 | Pedersen | ................. | F25B 41/00 |
| | | | | 165/279 |
| 2012/0298335 A1* | 11/2012 | Eckberg | ............... | H05K 7/2079 |
| | | | | 165/104.19 |
| 2013/0107447 A1* | 5/2013 | Campbell | .......... | H05K 7/20709 |
| | | | | 361/679.47 |
| 2013/0118712 A1* | 5/2013 | Iyengar | ............. | H05K 7/20736 |
| | | | | 165/104.14 |
| 2013/0133873 A1* | 5/2013 | Campbell | .......... | H05K 7/20281 |
| | | | | 165/281 |
| 2013/0138253 A1* | 5/2013 | Chainer | ............. | H05K 7/20281 |
| | | | | 700/282 |
| 2014/0060799 A1* | 3/2014 | Eckberg | ............. | G05D 23/1932 |
| | | | | 165/287 |
| 2014/0158341 A1* | 6/2014 | Campbell | ............... | F28F 27/02 |
| | | | | 165/287 |
| 2014/0202678 A1* | 7/2014 | Goth | ....................... | F28F 27/02 |
| | | | | 165/287 |
| 2015/0114616 A1* | 4/2015 | Lin | ................... | H05K 7/20781 |
| | | | | 165/287 |
| 2018/0228059 A1* | 8/2018 | Matsuo | ............. | H05K 7/20772 |
| 2019/0101964 A1* | 4/2019 | Luxford | ............ | H05K 7/20272 |
| 2019/0178592 A1* | 6/2019 | Chen | ................. | H05K 7/20836 |
| 2019/0243430 A1* | 8/2019 | Slaby | .................. | H05K 7/2079 |

* cited by examiner

US 11,280,565 B2

ADAPTING DEVICE AND HEAT DISSIPATION SYSTEM HAVING THE SAME

CROSS-REFERENCE TO RELATED APPLICATIONS

This non-provisional application claims priority under 35 U.S.C. § 119(a) on Patent Application No(s). 108108471 filed in Taiwan, R.O.C. on Mar. 13, 2019, the entire contents of which are hereby incorporated by reference.

TECHNICAL FIELD

The disclosure relates to an adapting device, more particularly to an adapting device for coolant distribution unit and a heat dissipation system having the same.

BACKGROUND

With the advent of big data and the internet era, the demand for providing cloud services has been rapidly increased. Therefore, the processing capability of computing devices such as network storage devices or server devices is constantly improved, and which also results in more and more heat. Thus, how to effectively dissipate the heat generated by a large number of servers that are stored in a server cabinet has a direct influence on the computing performance and the lifespan of these electronic devices.

Accordingly, liquid-cooling technology is gradually gaining attention. The liquid cooling uses coolant as a heat-dissipating medium and it is coupled with a pump to drive the coolant to form a continuous circulation in the applied system. The circulation is achieved by a group of pipe lines that can be distributed on the electronic components that will generates heat. When the coolant in a relatively low temperature flows through an electronic component in a relatively high temperature, it can directly absorb the heat energy to lower the temperature of the electronic component. The coolant that absorbs heat will have a heat exchange in another area to release its heat energy and then be cooled down and flows back to the circulation.

Regarding a server cabinet that has multiple heat sources, a coolant distribution unit (CDU) is provided to pump the coolant at a preset flow rate and pressure to different server hosts on the server cabinet via a manifold so as to simultaneously cool these server hosts. The coolant distribution unit can be cooperated with the aforementioned pumping and heat exchange system to continuously perform the cooling circulation.

The current coolant distribution units in the market are preferable to be small in size, convenient in installation and standardized in order to meet the needs of medium-sized enterprise users. However, with the increasing performance of the servers, the flow rate and static pressure of the coolant distribution units are not enough to fit the rapidly growing of energy density, such that it is difficult to provide a higher flow rate or static pressure to achieve a sufficient heat dissipation capability. Also, the conventional standardized coolant distribution units are often difficult to meet the different cooling requirements of the servers. And it is not an economical option to self-develop a specialized coolant distribution unit.

As a result, it is necessary to solve the problem that the preset specifications and heat dissipation capability of the conventional coolant distribution units do not satisfy the cooling requirements.

SUMMARY

One embodiment of the disclosure provides a heat dissipation system including a cabinet, a plurality of coolant distribution units and at least one adapting device. The cabinet has an outlet manifold and an inlet manifold. The coolant distribution units are disposed on the cabinet. Each of the coolant distribution units has a distribution outlet and a distribution inlet. The adapting device is disposed on the cabinet. The adapting device includes a casing and a plurality of switch valves. The casing has a plurality of first liquid inlets, a plurality of first liquid outlets, at least one second liquid inlet and at least one second liquid outlet. The plurality of first liquid inlets are configured to be respectively connected to the distribution outlets of the plurality of coolant distribution units, the plurality of first liquid outlets are configured to be respectively connected to the distribution inlets of the plurality of coolant distribution units, the at least one second liquid inlet is connected to the outlet manifold of the cabinet, and the at least one second liquid outlet is connected to the inlet manifold of the cabinet. The switch valves are disposed on the casing and connected to the plurality of first liquid inlets, the plurality of first liquid outlets, the at least one second liquid inlet and the at least one second liquid outlet so as to change a connection among the plurality of first liquid inlets, the plurality of first liquid outlets, the at least one second liquid inlet and the at least one second liquid outlet to change a connection between the plurality of coolant distribution units.

One embodiment of the disclosure provides an adapting device configured to be connected to a plurality of coolant distribution unit and a cabinet. The adapting device includes a plurality of switch valves configured to change a connection among the plurality of coolant distribution units and the cabinet.

BRIEF DESCRIPTION OF THE DRAWINGS

The present disclosure will become better understood from the detailed description given hereinbelow and the accompanying drawings which are given by way of illustration only and thus are not intending to limit the present disclosure and wherein.

DETAILED DESCRIPTION

Figure 1A:
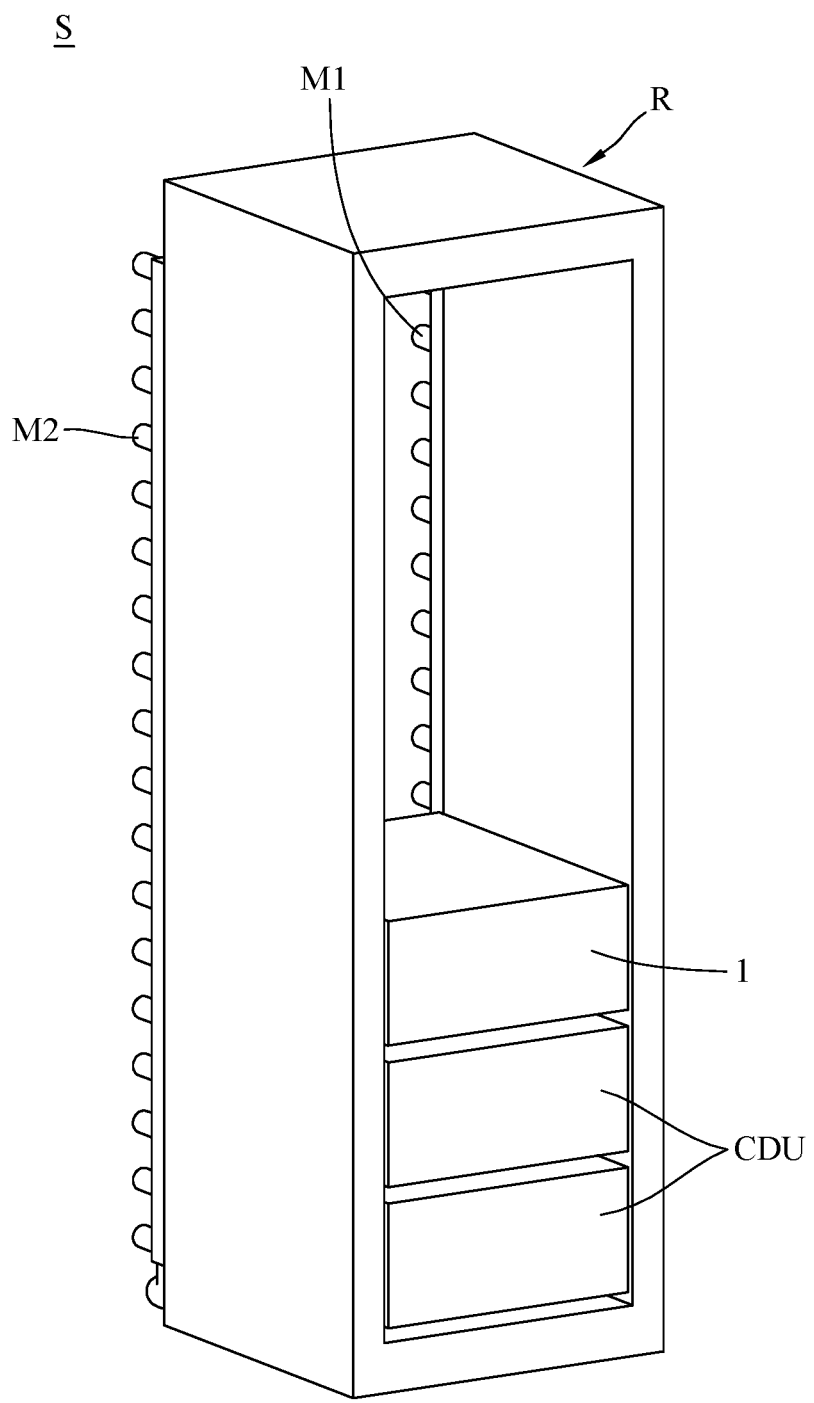
FIGS. 1A-1B are perspective views of a heat dissipation system having an adapting device according to one embodiment of the disclosure, taken from different points of view.

In the following detailed description, for purposes of explanation, numerous specific details are set forth in order to provide a thorough understanding of the disclosed embodiments. It will be apparent, however, that one or more embodiments may be practiced without these specific details. In other instances, well-known main structures and devices are schematically shown in order to simplify the drawing.

In addition, the terms used in the following paragraphs should be read on the meaning commonly used in the related fields and will not be overly explained, unless the terms have a specific meaning in the present disclosure. Furthermore, in order to simplify the drawings, some conventional structures and components are drawn in a simplified manner to keep the drawings clean. And the size, ratio, and angle of the components in the drawings of the present disclosure may be exaggerated for illustrative purposes.

Further, the terms, such as "end", "portion", "part", "area" and the like may be used in the following paragraphs to describe specific features but are not intended to limit the disclosure. Also, the following paragraphs may use terms, such as "substantially", "approximately" or "about"; when these terms are used in combination with size, concentration, temperature or other physical or chemical properties or characteristics, they are used to express that, the deviation existing in the upper and/or lower limits of the range of these properties or characteristics or the acceptable tolerances caused by the manufacturing tolerances or analysis process, would still able to achieve the desired effect.

Figure 1B:
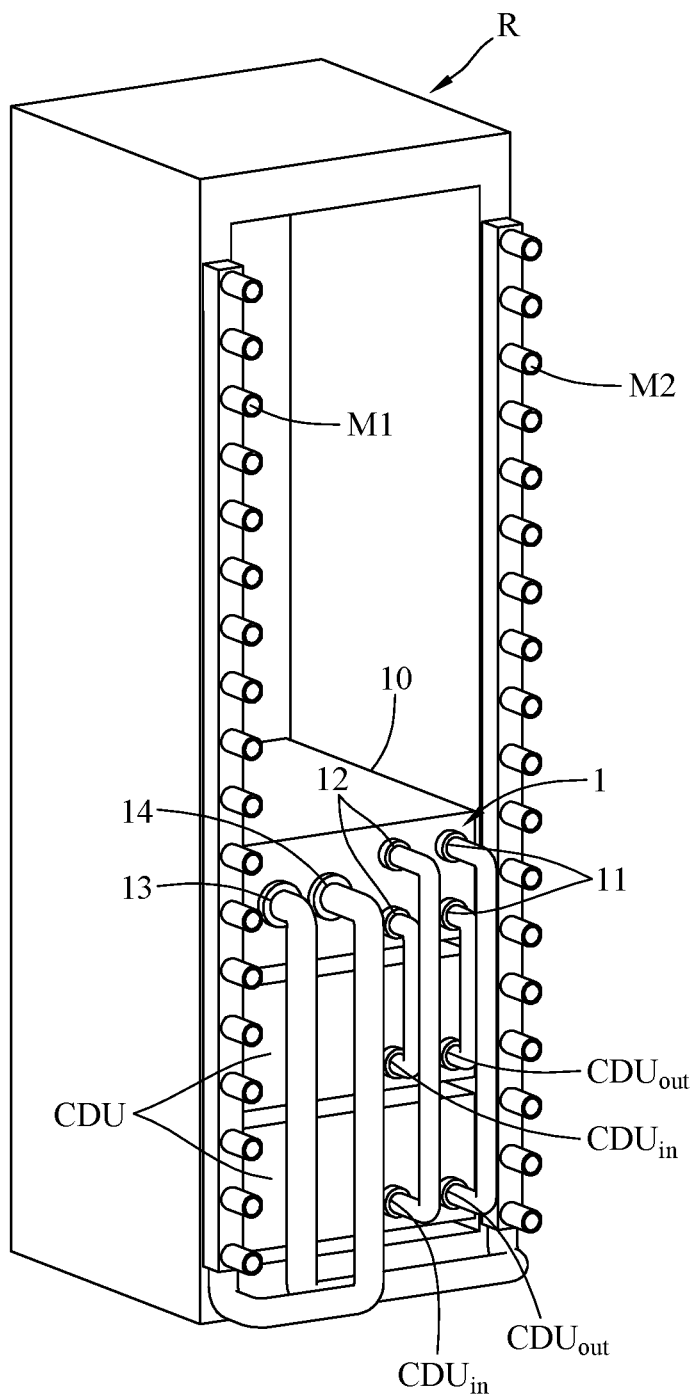

Firstly, please refer to FIGS. 1A-1B, FIGS. 1A-1B are perspective views of a heat dissipation system having an adapting device according to one embodiment of the disclosure, taken from different points of view. This embodiment provides a heat dissipation system S having an adapting device 1. As shown in the figures, the adapting device 1 can be adapted to a cabinet R. In this embodiment, the cabinet R is, for example, a server cabinet so that it can also be called a 'server cabinet R', but the disclosure is not limited thereto and is either not limited by the type or configuration of the server cabinet R or the quantity of the server hosts that the server cabinet R is able to accommodate. In addition, the server cabinet R can be installed with one or more coolant distribution units (CDU) CDU, but the disclosure is not limited by the configurations or locations of the coolant distribution units CDU. The coolant distribution units CDU on the server cabinet R can have the same or different specifications.

Each coolant distribution unit CDU is configured to distribute the coolant at a preset flow rate or pressure, but the values and ranges of the preset flow rate or pressure are predetermined by the specification of the coolant distribution unit CDU, and the disclosure is not limited thereto. However, the coolant distribution unit CDU is in a standard specification, so it only allows a very limited adjustment and sometimes is unable to reach some certain flow rates or pressures. Also, the flow rate or pressure of coolant provided by the single coolant distribution unit CDU is usually too low to provide a sufficient heat dissipation capability when the quantity of the server hosts on the server cabinet R increases. Therefore, the adapting device 1 of the embodiment is provided to integrate multiple coolant distribution units CDU and change the connection between these coolant distribution units CDU, such that the coolant distribution units CDU can be in serial connection, parallel connection or a combination thereof so as to achieve a sufficient heat dissipation capability.

Then, the connection among the adapting device 1, the coolant distribution units CDU and the server cabinet R will be described hereinafter. In this embodiment or some other embodiments, there are an inlet manifold M1 and an outlet manifold M2 disposed on sidewalls (not numbered) of the server cabinet R, but the disclosure is not limited by the inlet manifold M1 and outlet manifold M2 and their configurations. The adapting device 1 is configured to be connected between the coolant distribution units CDU and the inlet manifold M1 and the outlet manifold M2 of the server cabinet R so as to pump the coolant therethrough. In detail, a casing 10 of the adapting device 1 may include a plurality of first liquid inlets 11, a plurality of first liquid outlets 12, at least one second liquid inlet 13 and at least one second liquid outlet 14. The coolant distribution unit CDU is able to steadily pump coolant into the first liquid inlet 11 of the adapting device 1 from its distribution outlet $CDU_{out}$ through pipe line (not numbered). The adapting device 1 is able to pump the coolant to the inlet manifold M1 of the server cabinet R from its second liquid outlet 14 through pipe line (not numbered), and the inlet manifold M1 can distribute the coolant to the cold plates (not shown) of the server hosts on the server cabinet R so as to absorb heat energy from the server hosts. Then, the heat energy raises the temperature of the coolant and turns it into gas form, and the coolant in gas form is then pumped to the second liquid inlet 13 of the adapting device 1 from the outlet manifold M2 of the server cabinet R via pipe line (not numbered) so as to flow back to the adapting device 1. Then, the adapting device 1 is able to pump the coolant to the distribution inlet $CDU_{in}$ of the coolant distribution unit CDU from its first liquid outlet 12 through pipe line (not numbered). The coolant distribution unit CDU then will pump the coolant through a pipe line (not shown) to an external or internal heat exchanger to release the heat energy of the coolant, and then the low temperature coolant will flow back to complete a cooling circulation.

It is noted that the disclosure is not limited by the coolant or the cooling circulation of the coolant, and the disclosure is either not limited by that the coolant may be in liquid form, gas form or liquid-gas form during the cooling circulation. In addition, the quantities of the aforementioned first liquid inlets 11, the first liquid outlets 12, the second liquid inlet 13 and the second liquid outlet 14 can be altered according to the actual requirements; for example, the quantities of the above components can be altered according to the quantity of the coolant distribution units CDU, and the disclosure is not limited thereto.

Figure 2:
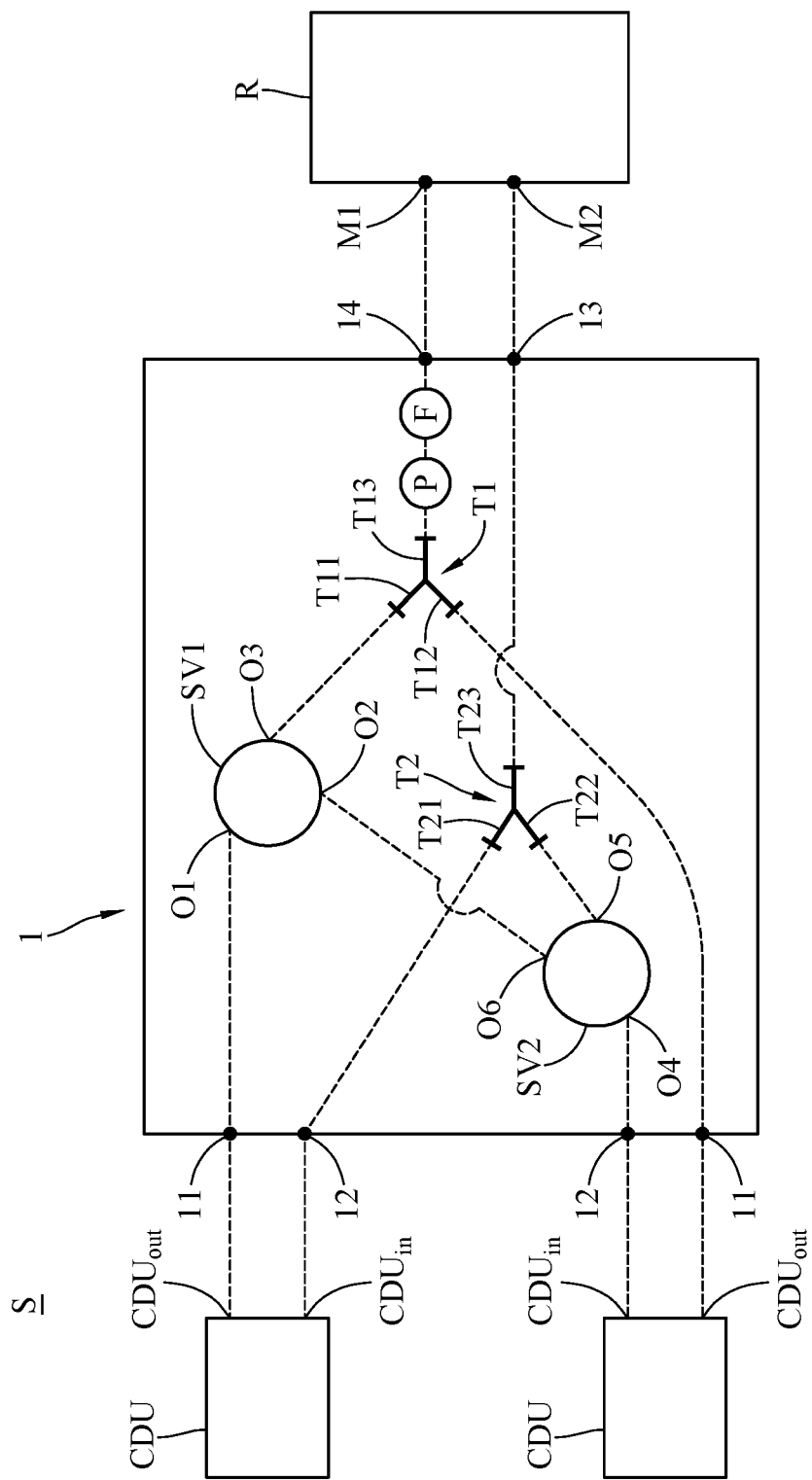
FIG. 2 is a connection diagram showing the connection among the adapting device, coolant distribution units and a server cabinet in FIG. 1A.

Then, the internal configuration of the adapting device 1 will be described hereinafter to introduce how to adjust the overall performance of the coolant distribution units CDU by the adapting device 1. Please further refer to FIG. 2, which is a connection diagram showing the connection among the adapting device 1 of the embodiment, the coolant distribution units CDU and the server cabinet R. It is noted that the FIG. 2 is a simple schematic diagram for providing a general ideas of the pipe line connection of the adapting device 1 but not the actual internal configuration of the adapting device 1. In fact, the locations of the first liquid inlets 11, the first liquid outlets 12, the second liquid inlet 13 and the second liquid outlet 14 and/or other components or pipe lines in the adapting device 1 in FIG. 2 are not limited and can be changed according to the actual requirements, any adjustment of which would not affect the following description of the internal and external connection with respect to the adapting device 1, and disclosure is not limited thereto. In addition, the adapting device 1 is exemplary of the adapting device of the disclosure for the explanation of the spirit of the disclosure, and the disclosure is not limited thereto.

In this embodiment, the adapting device 1 may further include a first switch valve SV1, a second switch valve SV2, a first multiple-ways pipe T1, a second multiple-ways pipe T2 and internal pipe lines (not numbered) for connecting the aforementioned components. The switch valves SV1 and SV2 may be mechanical type or electromagnetic type valves and each of them can be a three-way valve or multiple-ways valve. In this embodiment, the first switch valve SV1 and the second switch valve SV2 are, for example, three-way valves, but the disclosure is not limited thereto. The first multiple-ways pipe T1 and second multiple-ways pipe T2 can be, but not limited to, a T-shaped or Y-shaped pipe that has three pipe portions. The quantity of the pipe portions of the multiple-ways pipe may be altered according to actual requirements.

In more detail, in this embodiment, the first switch valve SV1 has a first port O1, a second port O2 and a third port O3. The first switch valve SV1 can be selectively switched to let the first port O1 to connect to the second port O2 or the third port O3. The second switch valve SV2 has a first port O4, a second port O5 and a third port O6. The second switch valve SV2 can be selectively switched to let the first port O4 to connect to the second port O5 or the third port O6. In addition, the first multiple-ways pipe T1 has a first pipe portion T11, a second pipe portion T12, and a third pipe portion T13; and the second multiple-ways pipe T2 has a first pipe portion T21, a second pipe portion T22, and a third pipe portion T23.

Regarding the connection, the first port O1, the second port O2 and the third port O3 of the first switch valve SV1 may be respectively connected to one of the first liquid inlets 11, the third port O6 of the second switch valve SV2, and the first pipe portion T11 of the first multiple-ways pipe T1 through the pipe lines; the first port O4, the second port O5 and the third port O6 of the second switch valve SV2 may be respectively connected to one of the first liquid outlets 12, the second pipe portion T22 of the second multiple-ways pipe T2, and the second port O2 of the first switch valve SV1 through the pipe lines; the first pipe portion T11, the second pipe portion T12 and the third pipe portion T13 of the first multiple-ways pipe T1 may be respectively connected to the third port O3 of the first switch valve SV1, the other first liquid inlet 11, and the second liquid outlet 14 through the pipe lines; and the first pipe portion T21, the second pipe portion T22 and the third pipe portion T23 of the second multiple-ways pipe T2 may be respectively connected to the other first liquid outlet 12, the second port O5 of the second switch valve SV2, and the second liquid inlet 13 through the pipe lines.

As such, the distribution outlet $CDU_{out}$ of one of the coolant distribution units CDU can be connected to the first pipe portion T11 of the first multiple-ways pipe T1 or the second switch valve SV2 via the first liquid inlet 11 and the first switch valve SV1, depending on whether the first port O1 of the first switch valve SV1 is connected to the second port O2 or the third port O3; the distribution inlet CDU of the other coolant distribution unit CDU can be connected to the first switch valve SV1 or the second pipe portion T22 of the second multiple-ways pipe T2 via the first liquid outlet 12 and the second switch valve SV2, depending on whether the first port O4 of the second switch valve SV2 is connected to the second port O5 or the third port O6.

Figure 3A:
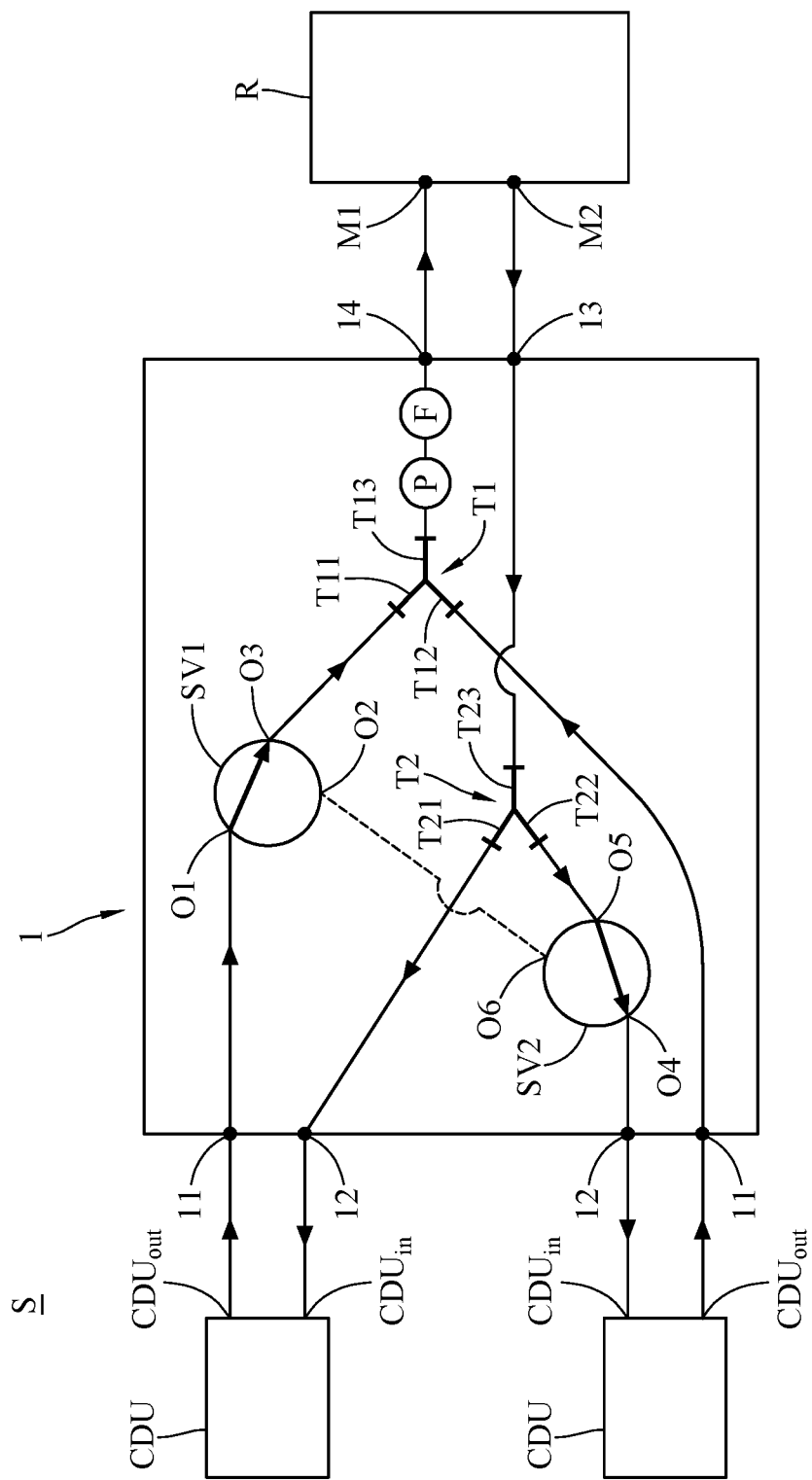
FIG. 3A is a connection diagram showing the connection among the adapting device, the coolant distribution units and the server cabinet when the coolant distribution units are parallel connected by the adapting device.

Then, please refer to FIG. 3A, which is a connection diagram showing that the coolant distribution units CDU are parallel connected by the adapting device 1, and the arrows in FIG. 3A represent the current connection states of the first switch valve SV1 and the second switch valve SV2.

As shown in figure, in this case, the first switch valve SV1 is switched to let the first port O1 to connect to the third port O3, and the second switch valve SV2 is switched to let the first port O4 to connect to the second port O5. At this moment, the coolant can flow through the distribution outlet $CDU_{out}$ of one of the coolant distribution units CDU so as to flow through one of the first liquid inlets 11 of the adapting device 1, the first port O1 and third port O3 of the first switch valve SV1, the first pipe portion T11 and third pipe portion T13 of the first multiple-ways pipe T1, the second liquid outlet 14 of the adapting device 1 and then flow into the inlet manifold M1 of the server cabinet R; meanwhile, the coolant can also flow through the distribution outlet $CDU_{out}$ of the other coolant distribution unit CDU so as to flow through the other first liquid inlet 11 of the adapting device 1, the second pipe portion T12 and third pipe portion T13 of the first multiple-ways pipe T1, the second liquid outlet 14 of the adapting device 1 and then flow into the inlet manifold M1 of the server cabinet R. According to the measurement result, the two coolant distribution units CDU in parallel connection can contribute an increased flow rate of coolant.

Then, the coolant can flow back to the adapting device 1 from the outlet manifold M2 of the server cabinet R so as to flow through the second liquid inlet 13 of the adapting device 1 and the third pipe portion T23 of the second multiple-ways pipe T2, and then flow through the first pipe portion T21 and the second pipe portion T22 of the second multiple-ways pipe T2 to the two coolant distribution units CDU. In detail, the bypassed coolant from the first pipe portion T21 of the second multiple-ways pipe T2 can flow back to the distribution inlet $CDU_{in}$ of one of the coolant distribution units CDU via one of the first liquid outlets 12 of the adapting device 1; and the another bypassed coolant from the second pipe portion T22 of the second multiple-ways pipe T2 can flow back to the distribution inlet $CDU_{in}$ of the other coolant distribution unit CDU via the second port O5 and the first port O4 of the second switch valve SV2 and the other first liquid outlet 12 of the adapting device 1.

Accordingly, the first switch valve SV1 and the second switch valve SV2 of the adapting device 1 can change the connection among the first liquid inlets 11, the first liquid outlets 12, the second liquid inlet 13 and the second liquid outlet 14 so as to change the connection between the coolant distribution units CDU.

Figure 3B:
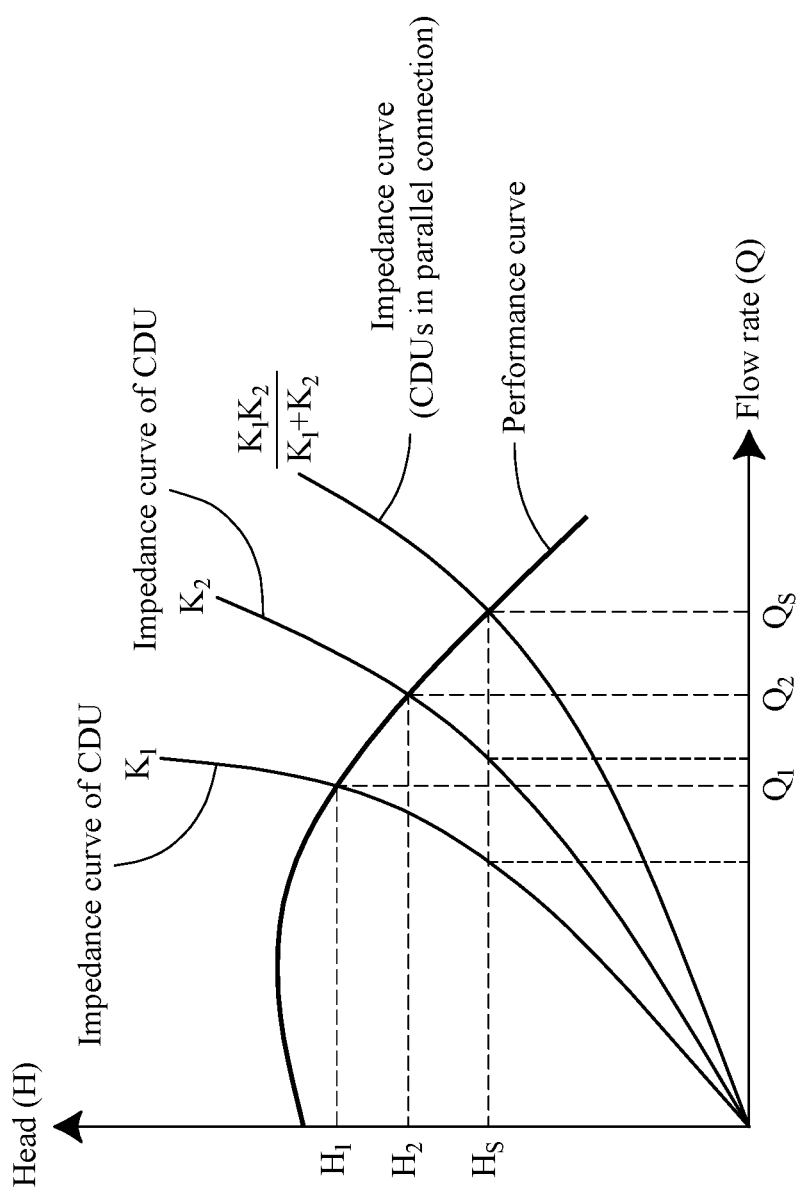
FIG. 3B is a performance curve diagram of the coolant distribution units in FIG. 3A that are in parallel connection.

Herein, please further refer to FIG. 3B, which is a performance curve diagram of the coolant distribution units CDU in parallel connection. Assume that the coolant distribution units CDU have different impedance curves, as shown in the performance curve, the flow rate (Q) of the heat dissipation system S is significantly increased when the coolant distribution units CDU are parallel connected by the adapting device 1. That is, the adapting device 1 is able to parallel connect the coolant distribution units CDU so as to improve the overall flow rate of the coolant distribution units CDU.

Figure 4A:
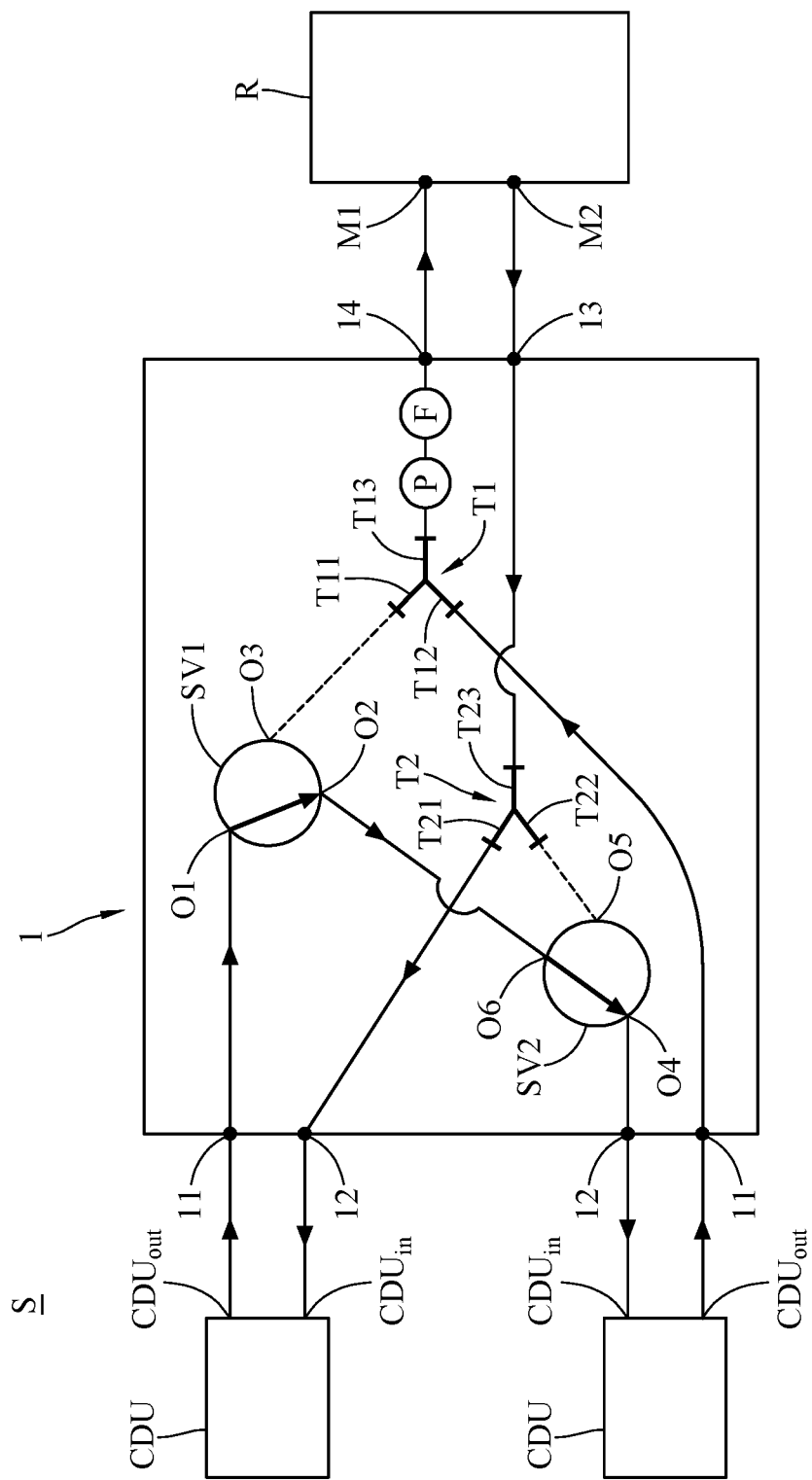
FIG. 4A is a connection diagram showing the connection among the adapting device, the coolant distribution units and the server cabinet when the coolant distribution units are serially connected by the adapting device.

Then, please refer to FIG. 4A, which is a connection diagram showing that the coolant distribution units CDU are serially connected by the adapting device 1, and the arrows in FIG. 4A represent the current connection states of the first switch valve SV1 and the second switch valve SV2.

As shown in figure, in this case, the first switch valve SV1 is switched to let the first port O1 to connect to the second port O2, and the second switch valve SV2 is switched to let the first port O4 to connect to the third port O6. At this moment, the coolant can flow through the distribution outlet $CDU_{out}$ of one of the coolant distribution units CDU so as to flow through one of the first liquid inlets 11 of the adapting device 1, the first port O1 and second port O2 of the first switch valve SV1, the third port O6 and first port O4 of the second switch valve SV2, one of the first liquid outlets 12 of the adapting device 1, and the distribution inlet $CDU_{in}$ of the other coolant distribution unit CDU, such that the coolant of the coolant distribution units CDU are converged and pumped out from one of the distribution outlets $CDU_{out}$, then, the converged coolant flows through the other first liquid inlet 11 of the adapting device 1, the second pipe portion T12 and third pipe portion T13 of the first multiple-ways pipe T1, the second liquid outlet 14 of the adapting device 1 and then flows into the inlet manifold M1 of the server cabinet R. As such, the two coolant distribution units CDU are in serial connection. According to the measurement result, the two coolant distribution units CDU in serial connection can contribute an increased pressure of coolant.

Then, the coolant can flow back to the adapting device 1 from the outlet manifold M2 of the server cabinet R so as to flow through the second liquid inlet 13 of the adapting device 1, the third pipe portion T23 and first pipe portion T21 of the second multiple-ways pipe T2, one of the first liquid outlets 12 of the adapting device 1 and one of the coolant distribution units CDU. As shown in the figure, the second port O5 of the second switch valve SV2 is not connected to the second multiple-ways pipe T2 so that the coolant will not flow to the second switch valve SV2 to the other coolant distribution unit CDU when it flows through the second multiple-ways pipe T2. Accordingly, due to the switch states of the first switch valve SV1 and second switch valve SV2 of the adapting device 1, the connection among the first liquid inlets 11, the first liquid outlets 12, the second liquid inlet 13 and the second liquid outlet 14 can be changed.

Figure 4B:
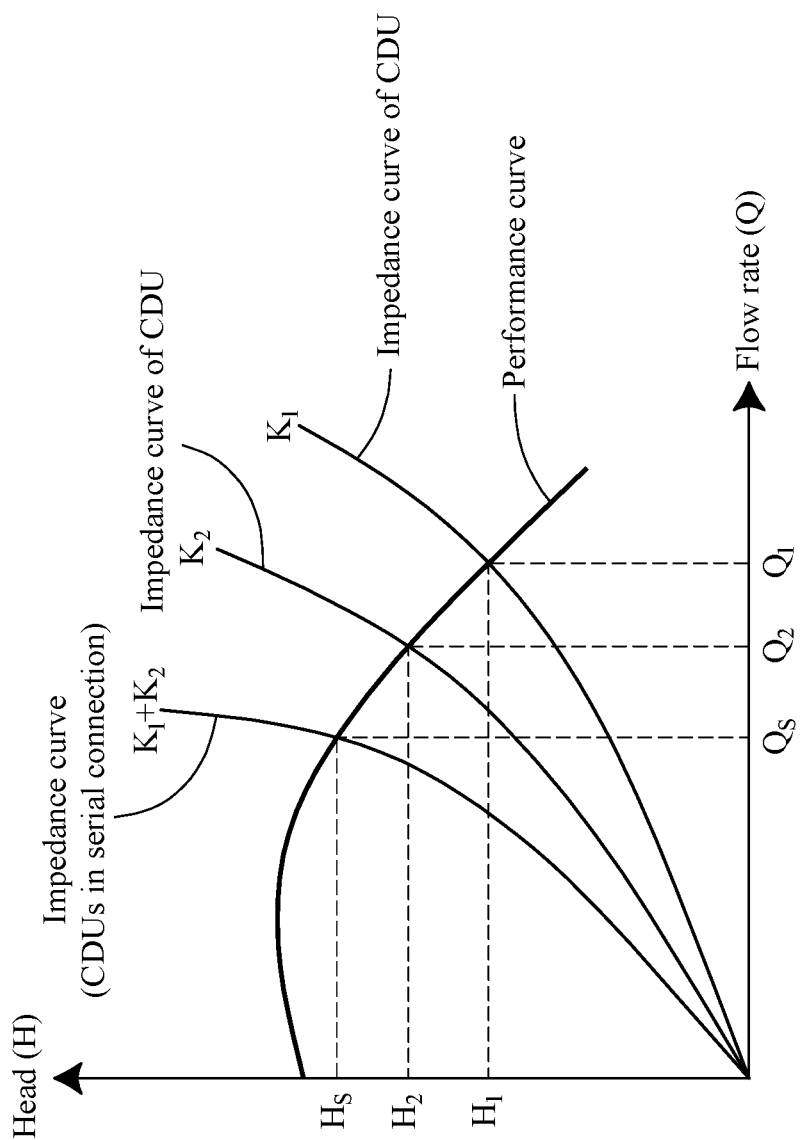
FIG. 4B is a performance curve diagram of the coolant distribution units in FIG. 4A that are in serial connection.

Herein, please further refer to FIG. 4B, which is a performance curve diagram of the coolant distribution units CDU in serial connection. As can be seen from the performance curve, the coolant distribution units CDU are serially connected by the adapting device 1, and the head (H) of the heat dissipation system S is significantly increased. That is, the adapting device 1 is able to serially connect the coolant distribution units CDU so as to improve the overall pressure of the coolant distribution units CDU.

As the serial and parallel connection discussed above, it is understood that the quantity and type of coolant distribution units that the adapting device of the disclosure is able to integrate are not limited, and the adapting device of the disclosure does not affect the usage of the coolant distribution units and server cabinet.

In addition, based on the above descriptions, those skilled in the art should be able to adjust the quantities of the switch valves, the multiple-ways pipe, the liquid inlets, the liquid outlets, and the coolant distribution units or use different types of coolant distribution units so as to integrate more coolant distribution units at the same time.

Figure 5:
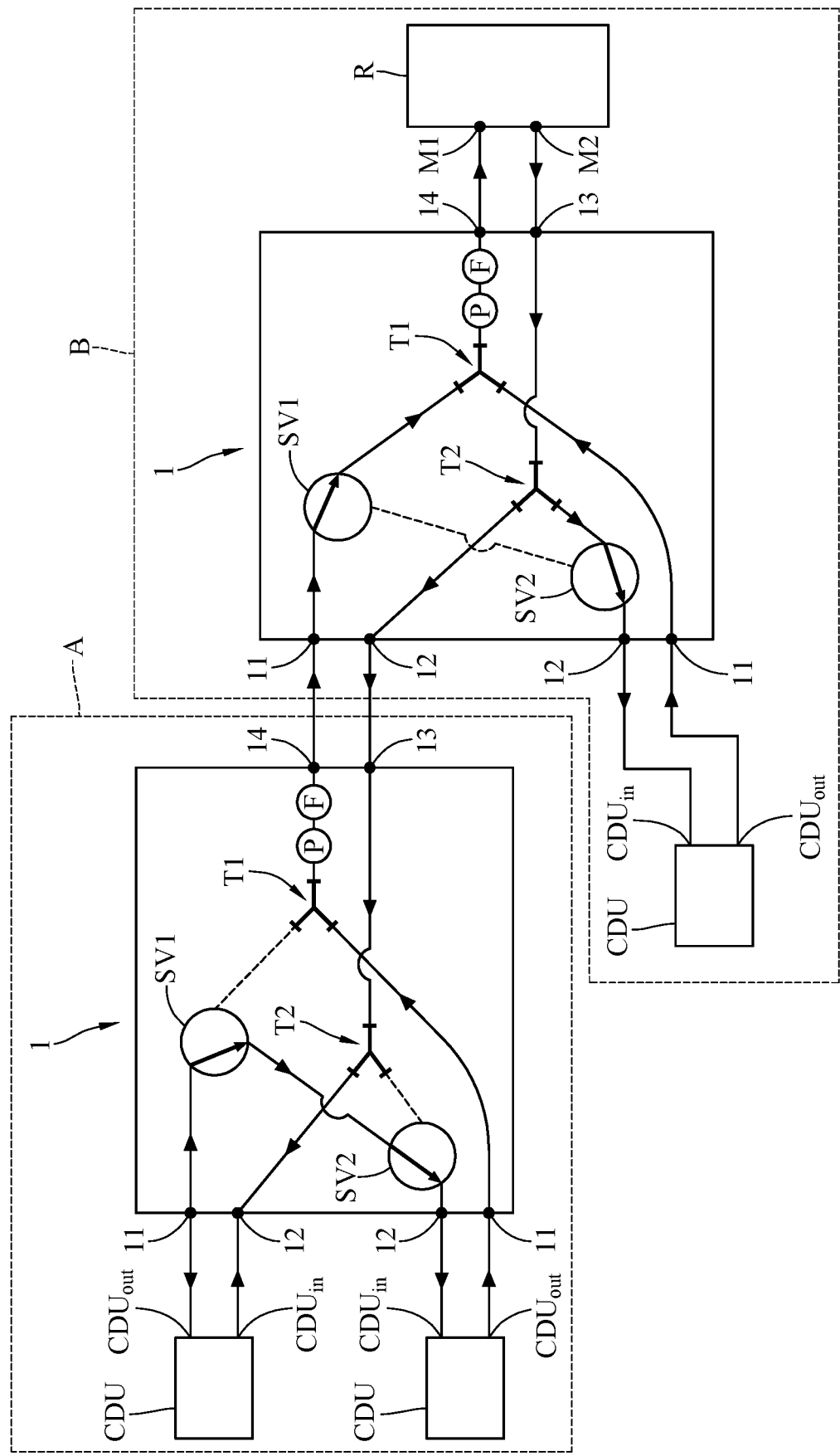
FIG. 5 is a connection diagram showing that three coolant distribution units are in serial and parallel connection by the adapting device.

For example, please refer to FIG. 5, which is a connection diagram showing that three coolant distribution units are in serial and parallel connection by the adapting device. The FIG. 5 is divided into an area A and an area B, but the areas A and B are merely provided for the purpose of illustration but not intended to represent the actual location and arrangement of the components therein. As shown in the figure, there are three coolant distribution units CDU and two adapting devices 1. In the area A, there are two coolant distribution units CDU serially connected by the adapting device 1, and they are connected to one of the first liquid inlets 11 and one of the first liquid outlets 12 of the other adapting device 1 in the area B. It is understood that the detail connection with respect to these two adapting devices 1 have been discussed in FIGS. 3A and 4A. That is, the two coolant distribution units CDU in the area A are serially connected by the adapting device 1 and then are parallel connected to the other coolant distribution unit CDU in the area B by the other adapting device 1. In short, increasing the quantity of the adapting devices 1 can parallel connect one coolant distribution unit CDU to the other two coolant distribution units CDU that are in serial connection.

In addition, as shown in FIGS. 2-5, in this embodiment, the adapting device 1 may further include a flow meter F and a pressure meter P that are disposed on the casing 10 and electrically connected to the coolant distribution units CDU. In detail, the flow meter F and the pressure meter P may be disposed on or near, for example, the second liquid outlet 14, for measuring the flow rate and pressure of the coolant and controlling one or all of the coolant distribution units CDU based on the flow rate and pressure.

For example, when the coolant distribution units CDU are serially or parallel connected by the adapting device 1, the overall flow rate and pressure of these coolant distribution units CDU can be obtained by the flow meter F and pressure meter P. If the flow rate of coolant requires to be adjusted, the flow meter F can adjust the flow rate of one or all of the coolant distribution units CDU to obtain a different flow rate of coolant; if the pressure of coolant requires to be adjusted, the pressure meter P can adjust the pressure of one or all of the coolant distribution units CDU to obtain a different pressure of coolant. Therefore, with the help of the flow meter F and pressure meter P, the flow rate and/or pressure of coolant provided by the coolant distribution units CDU can be automatically or manually adjusted. But the flow meter F and pressure meter P are optional, and the disclosure is not limited thereto.

According to the adapting device and the heat dissipation system having the same discussed above, the adapting device is configured to be connected between the coolant distribution units and the server cabinet and is able to adjust the connection between the coolant distribution units or individually adjust the coolant distribution units. Therefore, the adapting device of the disclosure is able to integrate various types of coolant distribution units so as to adjust the flow rate and pressure of the system. That is, the adapting device of the disclosure is high compatible, flexible and can be widely used to meet different cooling requirements without changing the framework of the current system or additional cost in redesign or redevelopment, which helps to save the cost and thus enhancing the competitiveness.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A heat dissipation system, comprising:
   a cabinet, having an outlet manifold and an inlet manifold;
   a plurality of coolant distribution units, disposed on the cabinet, wherein each of the plurality of coolant distribution units has a distribution outlet and a distribution inlet; and
   at least one adapting device, disposed on the cabinet, the at least one adapting device comprising:
   a casing, having a plurality of first liquid inlets, a plurality of first liquid outlets, at least one second liquid inlet and at least one second liquid outlet, wherein the plurality of first liquid inlets are configured to be respectively connected to the distribution outlets of the plurality of coolant distribution units, the plurality of first liquid outlets are configured to be respectively connected to the distribution inlets of the plurality of coolant distribution units, the at least one second liquid inlet is connected to the outlet manifold of the cabinet, and the at least one second liquid outlet is connected to the inlet manifold of the cabinet;

a first multiple-ways pipe and a second multiple-ways pipe, wherein the first multiple-ways pipe and the second multiple-ways pipe each have a first pipe portion, a second pipe portion and a third pipe portion; and a plurality of switch valves, disposed on the casing and connected to the plurality of first liquid inlets, the plurality of first liquid outlets, the at least one second liquid inlet and the at least one second liquid outlet so as to change a connection among the plurality of first liquid inlets, the plurality of first liquid outlets, the at least one second liquid inlet and the at least one second liquid outlet to change a connection between the plurality of coolant distribution units;

wherein the plurality of switch valves comprise a first switch valve and a second switch valve, and the first switch valve and the second switch valve each have a first port, a second port and a third port;

wherein the first port, the second port and the third port of the first switch valve are respectively connected to one of the plurality of first liquid inlets, the third port of the second switch valve, and the first pipe portion of the first multiple-ways pipe, the first port, the second port and the third port of the second switch valve are respectively connected to one of the plurality of first liquid outlets, the second pipe portion of the second multiple-ways pipe and the second port of the first switch valve, the first pipe portion, the second pipe portion and the third pipe portion of the first multiple-ways pipe are respectively connected to the third port of the first switch valve, another one of the plurality of first liquid inlets and the at least one second liquid outlet, the first pipe portion, the second pipe portion and the third pipe portion of the second multiple-ways pipe are respectively connected to another one of the plurality of first liquid outlets, the second port of the second switch valve and the at least one second liquid inlet.

2. The heat dissipation system according to claim 1, wherein the at least one adapting device further comprises a flow meter, the flow meter is connected to the at least one second liquid outlet and electrically connected to the plurality of coolant distribution units, and the flow meter is configured to measure a flow rate of the at least one second liquid outlet so as to adjust a flow rate of the plurality of coolant distribution units.

3. The heat dissipation system according to claim 1, wherein the at least one adapting device further comprises a pressure meter, the pressure meter is connected to the at least one second liquid outlet and electrically connected to the plurality of coolant distribution units, and the pressure meter is configured to measure a pressure of the at least one second liquid outlet so as to adjust a pressure of the plurality of coolant distribution units.

4. An adapting device, configured to be connected to a plurality of coolant distribution units and a cabinet, the adapting device comprising:

a casing, having a plurality of first liquid inlets, a plurality of first liquid outlets, at least one second liquid inlet and at least one second liquid outlet, wherein the plurality of first liquid inlets are configured to be respectively connected to distribution outlets of the plurality of coolant distribution units, the plurality of first liquid outlets are configured to be respectively connected to distribution inlets of the plurality of coolant distribution units, the at least one second liquid inlet is configured to be connected to an outlet manifold of the cabinet, and the at least one second liquid outlet is configured to be connected to an inlet manifold of the cabinet;

a first multiple-ways pipe and a second multiple-ways pipe, wherein the first multiple-ways pipe and the second multiple-ways pipe each have a first pipe portion, a second pipe portion and a third pipe portion; and a plurality of switch valves, configured to be disposed on the casing, wherein the plurality of switch valves are connected to and configured to change a connection among the plurality of first liquid inlets, the plurality of first liquid outlets, the at least one second liquid inlet and the at least one second liquid outlet so as to change a connection among the plurality of coolant distribution units and the cabinet;

wherein the plurality of switch valves comprises a first switch valve and a second switch valve, the first switch valve and the second switch valve each have a first port, a second port and a third port;

wherein the first port, the second port and the third port of the first switch valve are respectively connected to one of the plurality of first liquid inlets, the third port of the second switch valve and the first pipe portion of the first multiple-ways pipe, the first port, the second port and the third port of the second switch valve are respectively connected to one of the plurality of first liquid outlets, the second pipe portion of the second multiple-ways pipe and the second port of the first switch valve, the first pipe portion, the second pipe portion and the third pipe portion of the first multiple-ways pipe are respectively connected to the third port of the first switch valve, another one of the plurality of first liquid inlets and the at least one second liquid outlet, the first pipe portion, the second pipe portion and the third pipe portion of the second multiple-ways pipe are respectively connected to another one of the plurality of first liquid outlets, the second port of the second switch valve and the at least one second liquid inlet.

5. The adapting device according to claim 4, further comprising a flow meter, wherein the flow meter is connected to the at least one second liquid outlet and electrically connected to the plurality of coolant distribution units, and the flow meter is configured to measure a flow rate of the at least one second liquid outlet so as to adjust a flow rate of the plurality of coolant distribution units.

6. The adapting device according to claim 4, further comprising a pressure meter, wherein the pressure meter is connected to the at least one second liquid outlet and electrically connected to the plurality of coolant distribution units, and the pressure meter is configured to measure a pressure of the at least one second liquid outlet so as to adjust a pressure of the plurality of coolant distribution units.

* * * * *